United States Patent
Tabatabaie-Alavi et al.

(10) Patent No.: US 10,026,823 B1
(45) Date of Patent: Jul. 17, 2018

(54) SCHOTTKY CONTACT STRUCTURE FOR SEMICONDUCTOR DEVICES AND METHOD FOR FORMING SUCH SCHOTTKY CONTACT STRUCTURE

(71) Applicant: Raytheon Company, Waltham, MA (US)

(72) Inventors: Kamal Tabatabaie-Alavi, Sharon, MA (US); Kezia Cheng, Lowell, MA (US); Christopher J. MacDonald, Medford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/452,986

(22) Filed: Mar. 8, 2017

(51) Int. Cl.
*H01L 29/80* (2006.01)
*H01L 29/47* (2006.01)
*H01L 21/285* (2006.01)
*H01L 29/20* (2006.01)
*H01L 29/78* (2006.01)

(52) U.S. Cl.
CPC ...... *H01L 29/475* (2013.01); *H01L 21/28581* (2013.01); *H01L 29/2003* (2013.01); *H01L 29/7839* (2013.01)

(58) Field of Classification Search
CPC ............. H01L 29/812; H01L 29/42316; H01L 27/095; H01L 21/28185; H01L 21/761; H01L 27/0883
USPC ................................................. 257/280–281
See application file for complete search history.

(56) References Cited

U.S. PATENT DOCUMENTS

| | | | |
|---|---|---|---|
| 8,878,362 B2 | 11/2014 | Cheng | |
| 8,896,122 B2 | 11/2014 | Mieczkowski et al. | |
| 8,907,350 B2 | 12/2014 | Mieczkowski et al. | |
| 9,142,631 B2 | 9/2015 | Mieczkowski et al. | |
| 2011/0227089 A1* | 9/2011 | Mieczkowski et al. | H01L 29/42316 257/76 |
| 2013/0228924 A1 | 9/2013 | Cheng | |

* cited by examiner

*Primary Examiner* — Theresa T Doan
(74) *Attorney, Agent, or Firm* — Daly, Crowley, Mofford & Durkee, LLP (57) ABSTRACT

A Schottky contact structure for a semiconductor device having a Schottky contact and an electrode for the contact structure disposed on the contact. The Schottky contact comprises: a first layer of a first metal in Schottky contact with a semiconductor; a second layer of a second metal on the first layer; a third layer of the first metal on the second layer; and a fourth layer of the second metal on the third layer. The electrode for the Schottky contact structure disposed on the Schottky contact comprises a third metal, the second metal providing a barrier against migration between the third metal and the first metal.

14 Claims, 11 Drawing Sheets

SCHOTTKY CONTACT STRUCTURE FOR SEMICONDUCTOR DEVICES AND METHOD FOR FORMING SUCH SCHOTTKY CONTACT STRUCTURE

TECHNICAL FIELD

This disclosure relates generally to Schottky contact structures and more particularly to Schottky contact structures for semiconductor devices.

BACKGROUND

Figure 1:
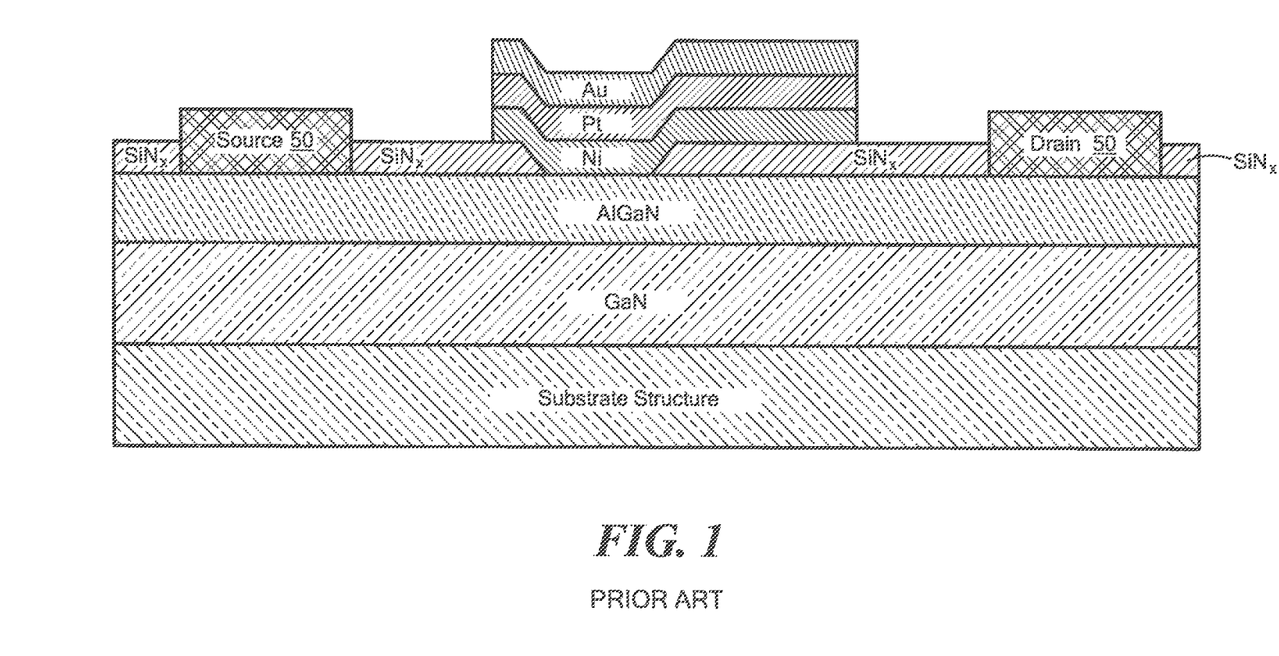
FIG. 1 is a diagrammatical, cross-sectional sketch of a FET according to the PRIOR ART.

As is known in the art, many semiconductor devices, such as Field Effect Transistors (FETs) include Schottky contact structures. For example, many FETs include a gate to control a flow of carriers between a source and a drain through a channel region in a semiconductor, such as a Groups III-Nitride semiconductor. One type of FET (FIG. 1) is a Gallium Nitride (GaN) FET having: a gate contact; and, an electrode; the gate contact having: a bottom metal of nickel (Ni) in Schottky contact with an AlGaN semiconductor layer and a low resistance electrode, such as gold (Au) with a barrier layer, such as Platinum (Pt) to protect against metal migration between the Au and the Ni. During high temperature operation of the GaN FET with Ni/Pt/Au Schottky gate, Au can migrate/diffuse from the edges of the gate metal structure into the AlGaN and cause gate leakage. Prior attempts included the use of Nickel oxide in place of the Ni/Pt, a post deposition anneal process, or making the Ni and Pt layers up to 4000 A thick. However, none of these approaches are compatible with high yield manufacturing of the GaN FET using photolithographic liftoff technique.

SUMMARY

In accordance with the present disclosure, a Schottky contact structure is provided having: a Schottky contact comprising a plurality of stacks of layers, each one of the stacks comprising a lower layer of Ni and upper layer of Pt; and wherein the lower one of one of the plurality of stacks of layers is in Schottky contact with a semiconductor layer.

In one embodiment, the Schottky contact structure includes an electrode on the Schottky contact.

In one embodiment, the plurality of stacks of layers provides a barrier against migration of material in the Schottky contact to the semiconductor layer.

In one embodiment, Schottky contact structure is provided. The Schottky contact structure includes a Schottky contact having: a first layer of a first metal in Schottky contact with a semiconductor, a second layer of a second metal on the first layer; a third layer of the first metal on the second layer; and a fourth layer of the second metal on the third layer.

In one embodiment, the Schottky contact structure includes: a fifth layer of the first metal on the fourth layer, and a sixth layer of the second metal on the fifth layer.

In one embodiment, the first metal is nickel; the second metal is platinum; and the third metal is gold.

In one embodiment, the second metal of the second layer is in direct contact with the first metal of the first layer.

In one embodiment, first metal of the third layer is in direct contact with the second metal of the fourth layer.

In one embodiment, the first metal of the fifth layer is in direct contact with the second metal of the fourth layer.

In one embodiment, first metal of the fifth layer is in direct contact with the second metal of the sixth layer.

In one embodiment, the Ni is in direct contact with the Pt.

In one embodiment, the electrode comprises a layer of gold on the Pt of the upper one of the plurality of stacks.

In one embodiment, the layer of gold is in direct contact with the Pt of the upper one of the plurality of stacks.

In one embodiment, a Field Effect Transistor is provided having: a source; a drain; and a gate electrode structure disposed between the source and the drain for controlling a flow of carriers between the source and the drain. The gate electrode structure comprising: a gate contact comprising a plurality of stacks of layers, each one of the stacks comprising a lower layer of Ni and upper layer of Pt; and wherein the lower one of one of the plurality of stacks of layers is in Schottky contact with the a semiconductor layer.

In one embodiment, the Field Effect Transistor includes an electrode on the gate contact.

In one embodiment, a method is provided for forming a Schottky contact structure comprising: providing an evaporation chamber having therein: a first metal source, a second metal source; and a semiconductor having mask over a surface of the semiconductor, such mask having a window therein the expose a portion of a surface of the semiconductor; evaporating a portion of a first metal from the first metal source and depositing the evaporated first metal onto the mask and onto the exposed portion of the surface of the semiconductor forming a Schottky contact between the portion of the first metal and the exposed portion of the semiconductor to form a first metal layer; evaporating a portion of a second metal from the second metal source and depositing the evaporated second metal over the deposited first metal to form a second metal layer over the first metal layer; evaporating a portion of the first metal from the first metal source and depositing the evaporated first metal over the deposited second metal to form a third metal layer over the second metal layer; and, evaporating a portion of the second metal from the second metal source and depositing the evaporated second metal over the deposited first metal of the third metal layer to form a fourth metal layer over the second metal layer.

In one embodiment, the evaporation chamber is provided with a third metal source and the method includes: evaporating a third metal from the third metal source onto the second metal of the fourth metal layer.

In one embodiment, the method includes: evaporating a portion of the first metal from the first metal source and depositing the evaporated first metal over the deposited second metal to form a fifth metal layer over the second metal layer; and evaporating a portion of the second metal from the second metal source and depositing the evaporated second metal over the deposited first metal of the fifth metal layer to form a sixth metal layer over the fifth metal layer.

In one embodiment, the evaporation chamber is provided with a third metal source and the method includes: evaporating a third metal from the third metal source onto the second metal of the sixth metal layer.

With such an arrangement, improved side-wall coverage is obtained that will create an effective barrier to Au migration to the semiconductor layer and thereby reduce gate leakage current. The relatively thin (less than 4000 Angstroms) alternating barrier layers is more effective than the use of a single thick Ni and Pt layers (greater than several thousand Angstroms) because grain structures of the individual layers are interrupted by arranging and alternating the Ni and Pt layers, thereby reducing the migration of the gold to the semiconductor layer reducing FET leakage.

The details of one or more embodiments of the disclosure are set forth in the accompanying drawings and the descrip-

DESCRIPTION OF DRAWINGS

Like reference symbols in the various drawings indicate like elements.

DETAILED DESCRIPTION

Figure 2:
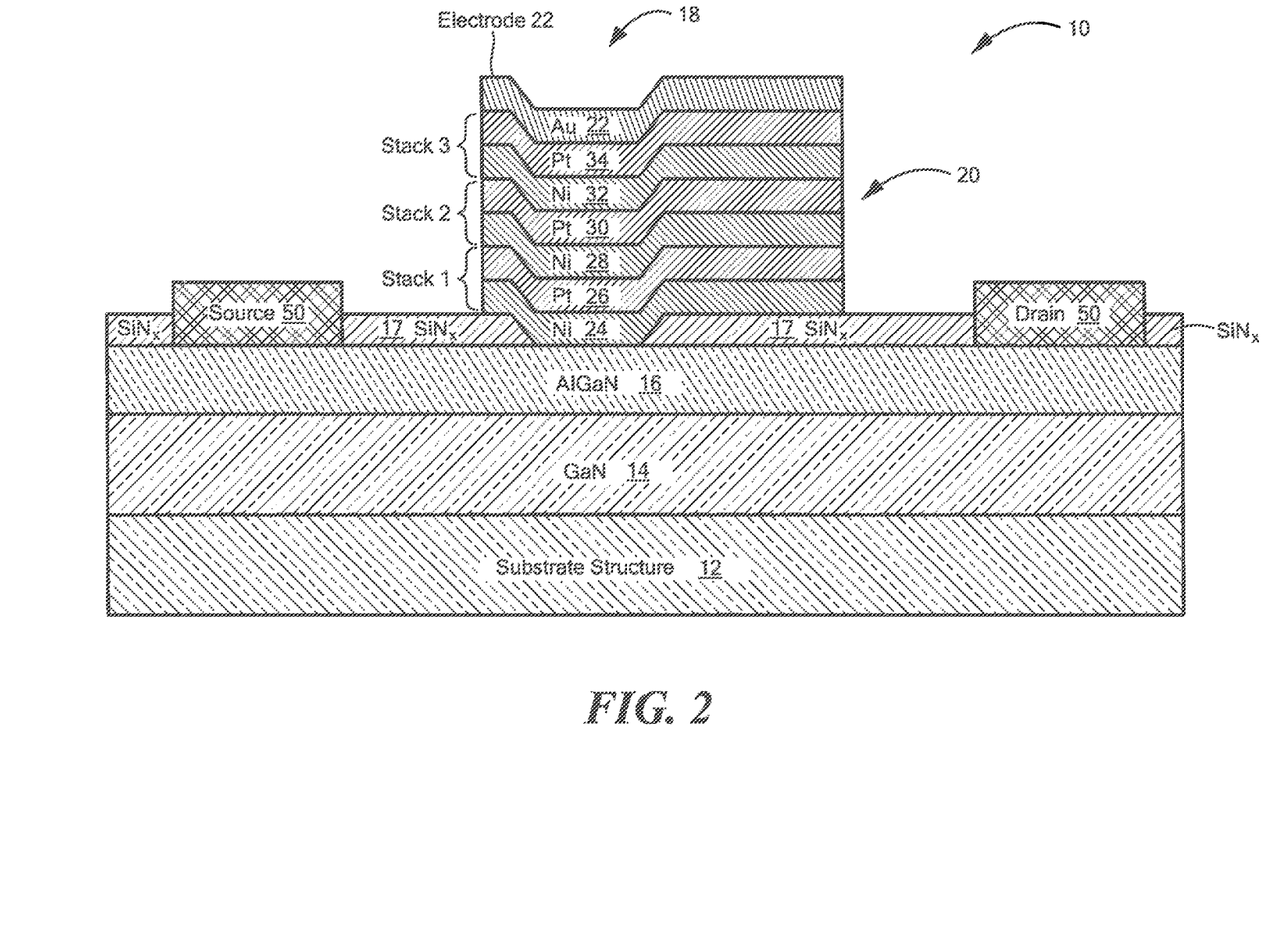
FIG. 2 is a diagrammatical, cross-sectional sketch of a FET according to the disclosure.

Referring now to FIG. 2, a semiconductor device, here, for example, a FET 10 is shown having a substrate structure 11 includes: a substrate 11, here for example, silicon (Si), silicon carbide (SiC), or silicon on insulator (SOI), GaAs, and InP. A layer of a Group III-N semiconductor layer 14, here GaN on an upper portion of the substrate 12; and a second Group III-N semiconductor layer 16, here aluminum gallium nitride ($Al_xGa_{1-x}N$, where x is 0<x≤1) on layer 16 and a dielectric layer 17, here for example $SiN_x$, over the AlGaN layer 16, as shown. It should be understood that the layer 14 is here a GaN buffer structure, which also includes nucleation and strain relief layers, not shown; typically aluminum nitride (AlN) and aluminum gallium nitride ($Al_xGa_{1-x}N$, where x is 0<x≤1).

The FET 10 includes a Schottky contact structure, here a gate electrode structure 18 having: a Schottky contact, here a gate contact 20; and, an electrode 22, disposed between a SOURCE, in ohmic contact with semiconductor layer 16, and a DRAIN, in ohmic contact with the semiconductor, for controlling a flow of carriers between the SOURCE and the DRAIN. More particularly, the gate contact 20 includes: a first layer 24 of a first metal in Schottky contact with the semiconductor layer 16; a second layer 26 of a second metal in direct contact with the first layer 24; a third layer 28 of the first metal in direct contact with the second layer 26; a fourth layer 30 of the second metal in direct contact with the third layer 28; a fifth layer 32 of the first metal in direct contact with the fourth layer 30; and a sixth layer 34 of the second metal in direct contact with the fifth layer 32. The electrode 22 for the gate electrode structure 18 disposed on the gate contact 20 includes a third metal; the second metal of layers 26, 30 and 34 providing a barrier against migration between the third metal of gate contact 20 to the semiconductor 16. Here, the first metal is nickel; the second metal is platinum; and the third metal is gold.

Thus, the gate electrode structure 18 includes: a gate contact 20 having a plurality of stacks of layers (here, a first stack having layers 24, 26; a second stack of having layers 28, 30; and a third stack of having layers 32, 34), each one of the stacks having a lower layer of Ni (the first stack having a lower layer 24; the second stack having a lower layer 28; and the third stack having a lower layer 32) and the upper layer of Pt (the first stack having an upper layer 26; the second stack having an upper layer 30; and the third stack having an upper layer 34). The lower layer 24 of the first one of the stacks is in Schottky contact with the semiconductor layer 16. The gate electrode structure 18 includes an electrode 22 on the gate contact 20. The plurality of stacks of layers (the first stack having layers 24, 26; the second stack of having layers 28, 30; and the third stack of having layers 32, 34) provide a barrier against migration of material in the contact 22 (here gold) to the semiconductor layer 16.

Figure 3A:
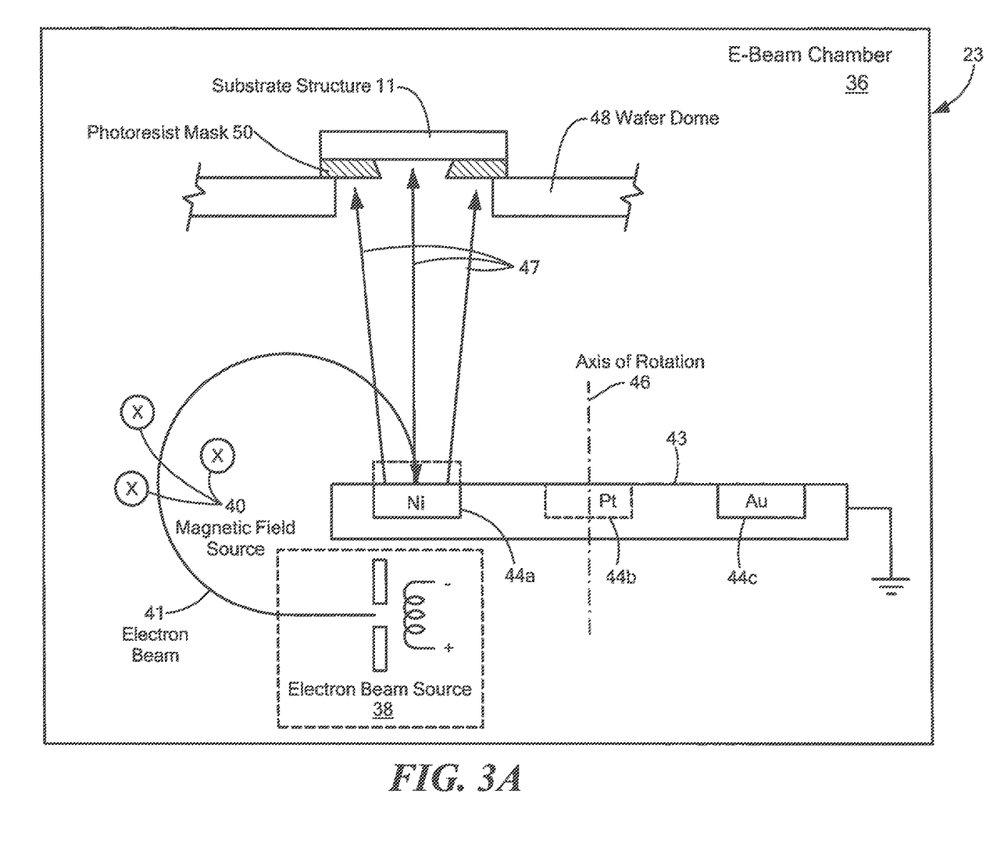
FIG. 3A is a simplified, diagrammatic sketch of electron beam evaporation apparatus used in the fabrication of the FET of FIG. 2.
Figure 3B:
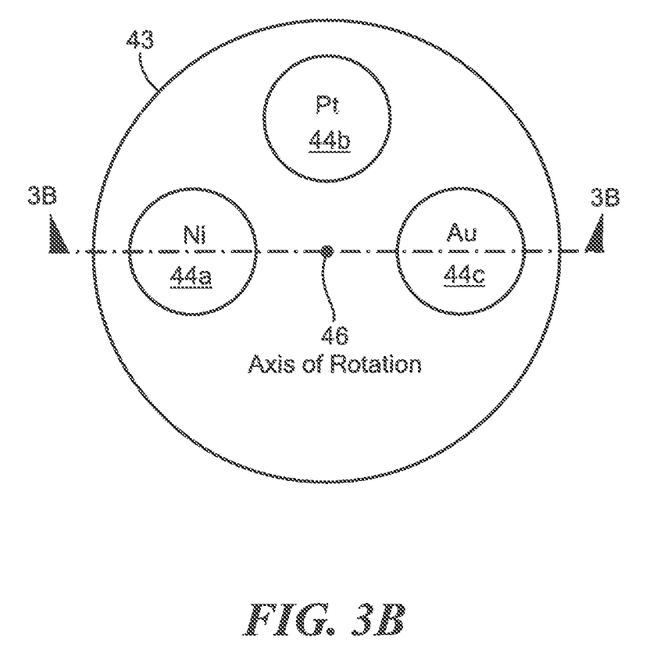
FIG. 3B is a diagrammatical view of a source hearth used in the electron beam evaporation apparatus of FIG. 3A, a cross-section of the hearth along line 3B-3B being shown in FIG. 3A.
Figure 4A:
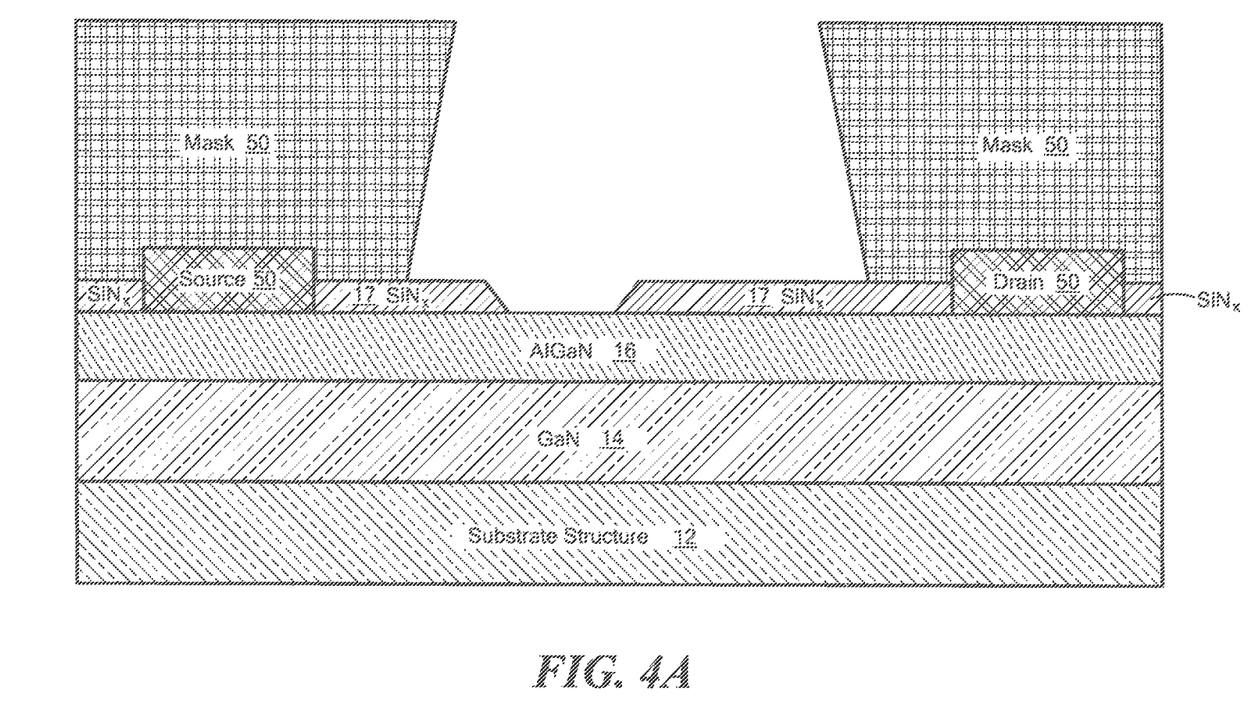
FIGS. 4A-4B taken together is a flow diagram of a process used to fabricate the FET according to the disclosure.

Referring now to FIGS. 3A and 3B, electron beam (E-beam) evaporating apparatus 34 is shown to include an enclosure, or chamber 36 having therein: an electron beam source 38 and a magnetic field source 40 arranged to direct an electron beam 41 produced by source 38 onto a predetermined target spatial region 42 within the chamber 36. The chamber 36 includes a rotatable crucible or hearth 43, here having, three metal sources, 44a, 44b, and 44c. Here, metal source 44a is Ni, metal source 44b is Pt and metal source 42c is Au. The hearth 43 is adapted to rotate about an axis of rotation 46, by any conventional motor operated positioning apparatus, not shown, to position a selected one of the three metal sources 44a, 44b, and 44c to the a predetermined target spatial region 42 so that the selected one of the three metal sources 44a, 44b, and 44c intercepts of the directed electron beam. The positioned one of the three metal sources 44a, 44b, and 44c thereby heated by the electron beam 41 and portions of the positioned one of the three metal sources 44a, 44b, and 44c are evaporated and pass in a detection indicated by the arrows 47 toward a wafer dome 48, as indicated. The wafer dome 48 supports the substrate structure 11 (FIG. 2) with a photoresist mask 50 over the SOURCE and DRAIN and over portions of the dielectric layer 17, such dielectric layer 17 having an opening thereon to expose a portion 53 of the surface of the AlGaN layer 16, as shown in FIG. 4A; the mask 50 having a window 51 exposing the portion 53 of the surface of the AlGaN layer 16, as shown FIG. 4A.

Referring now to FIGS. 5A-5D the process used to fabricate the FET 10 of FIG. 2, begins with providing the electron beam (E-beam) evaporating apparatus 34 (FIG. 3A, 3B, with the chamber 36 thereof having therein: the first metal source 44a, the second metal source 44b; a third metal source 44c; and a semiconductor 11 having mask 50 over a surface of the semiconductor 11, including over the SOURCE and the DRAIN. As shown, the mask 50 having a window 51 therein expose a portion 53 of a surface of the semiconductor 11.

The first metal source 44a in positioned in the path of the electron beam 41; more particularly, the hearth 43 is rotated about axis 46 to position the first source 44a into spatial region 42 (FIG. 3A).

Figure 4B:
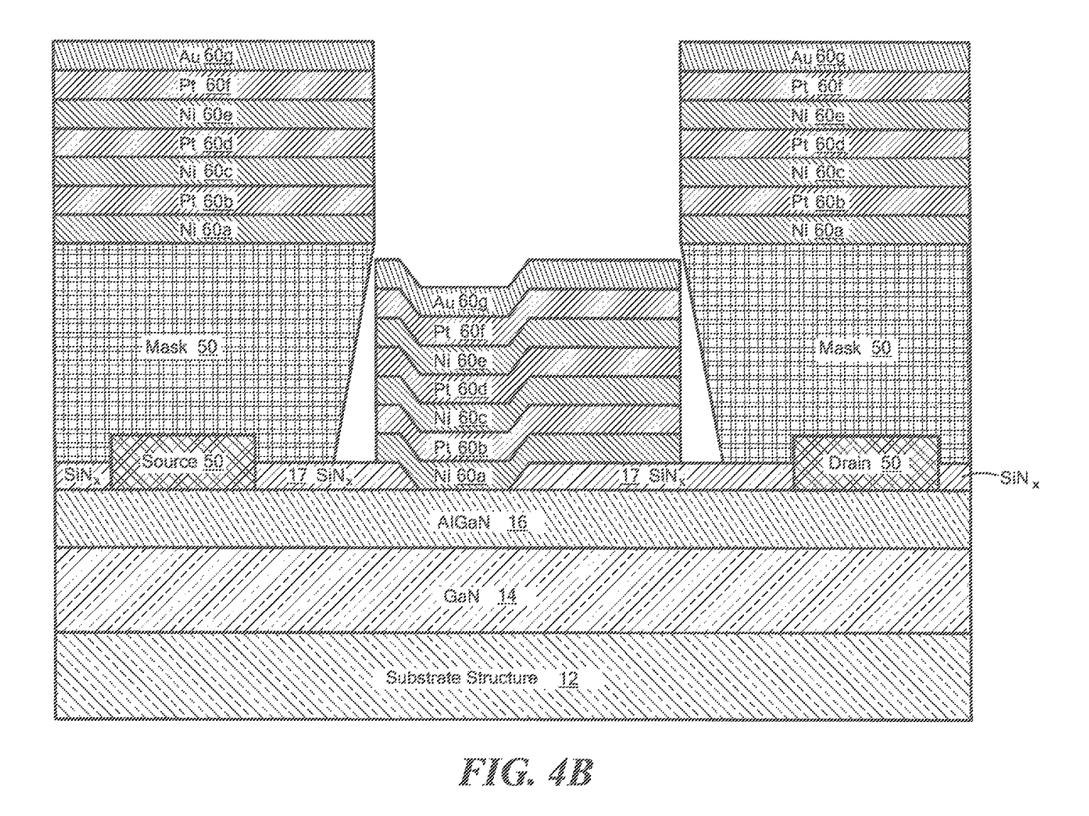
Figure 5A:
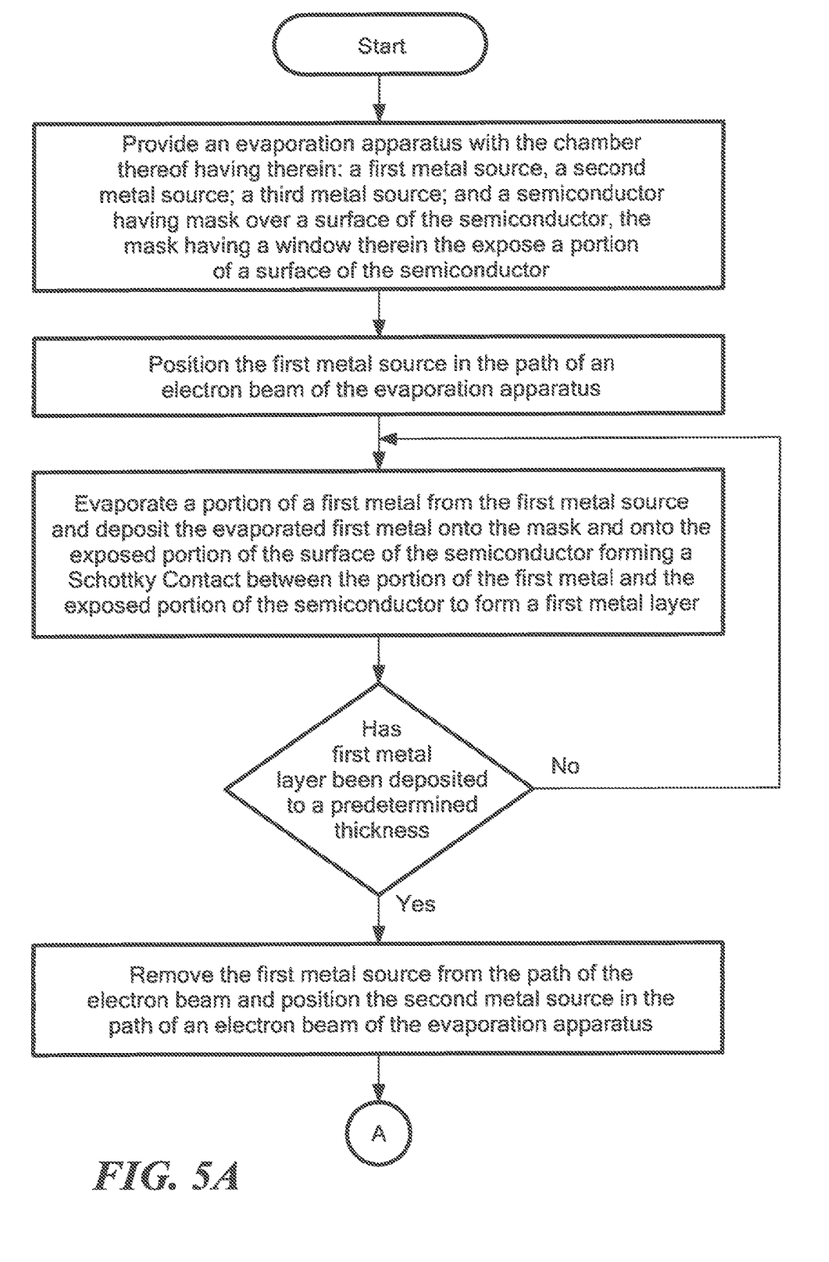
FIGS. 5A-5D are diagrammatical, cross-sectional sketch of a FET at various stages in the fabricatio thereof according to the disclosure.
Figure 5B:
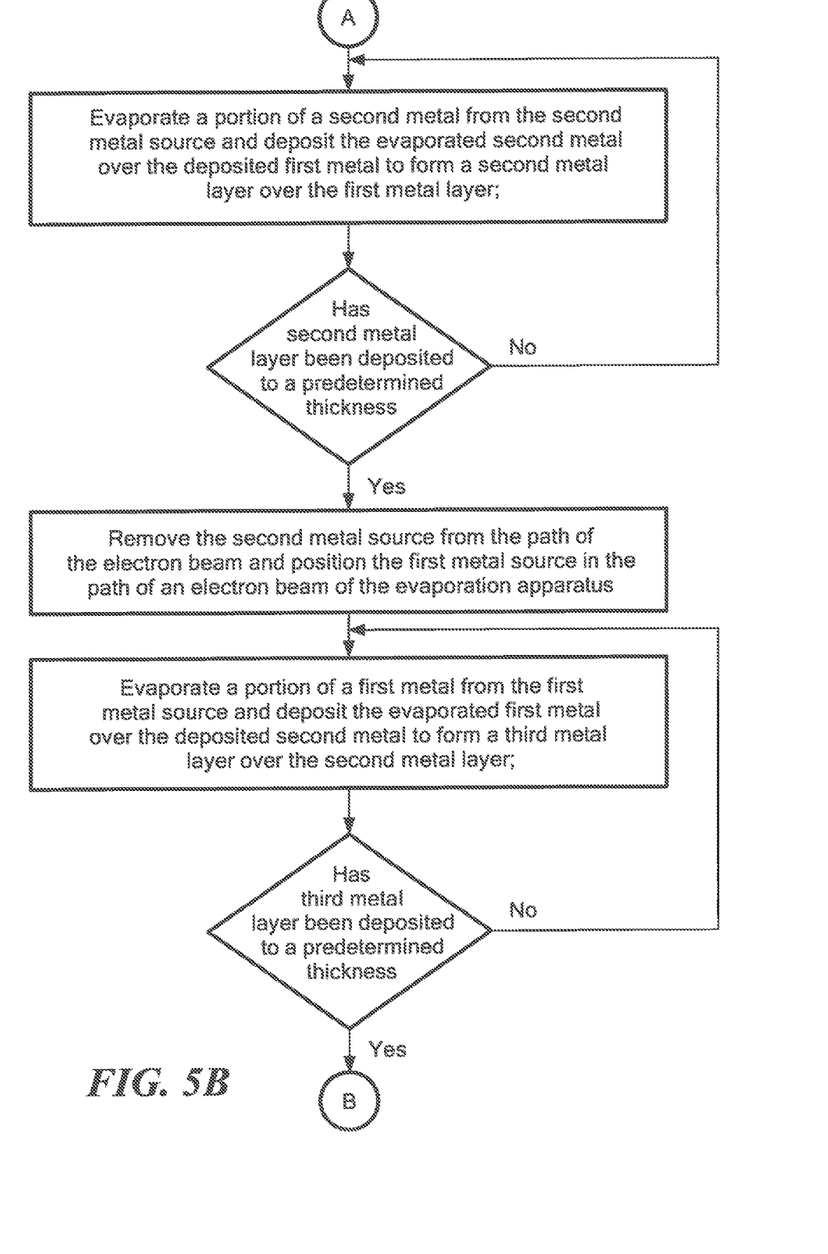
Figure 5C:
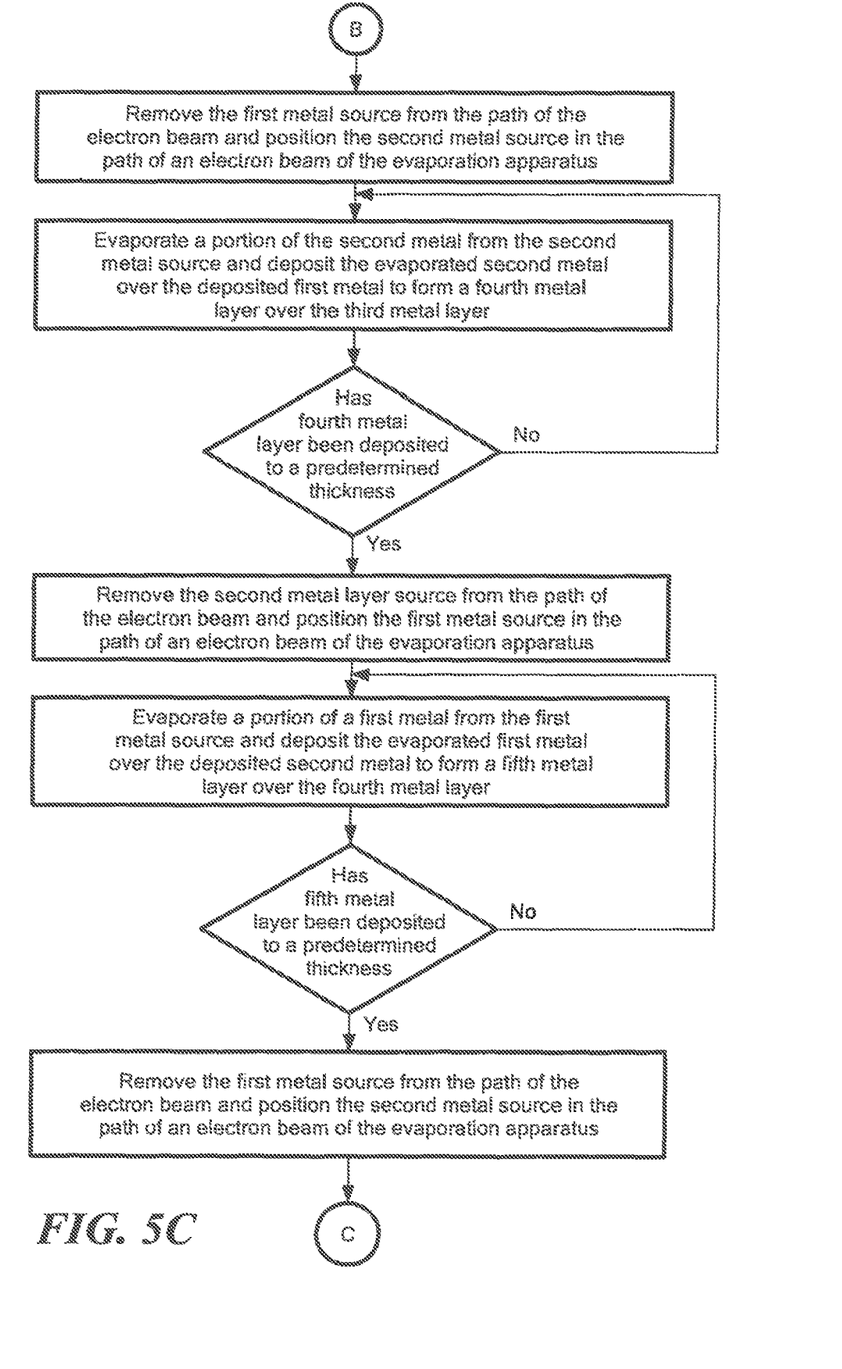
Figure 5D:
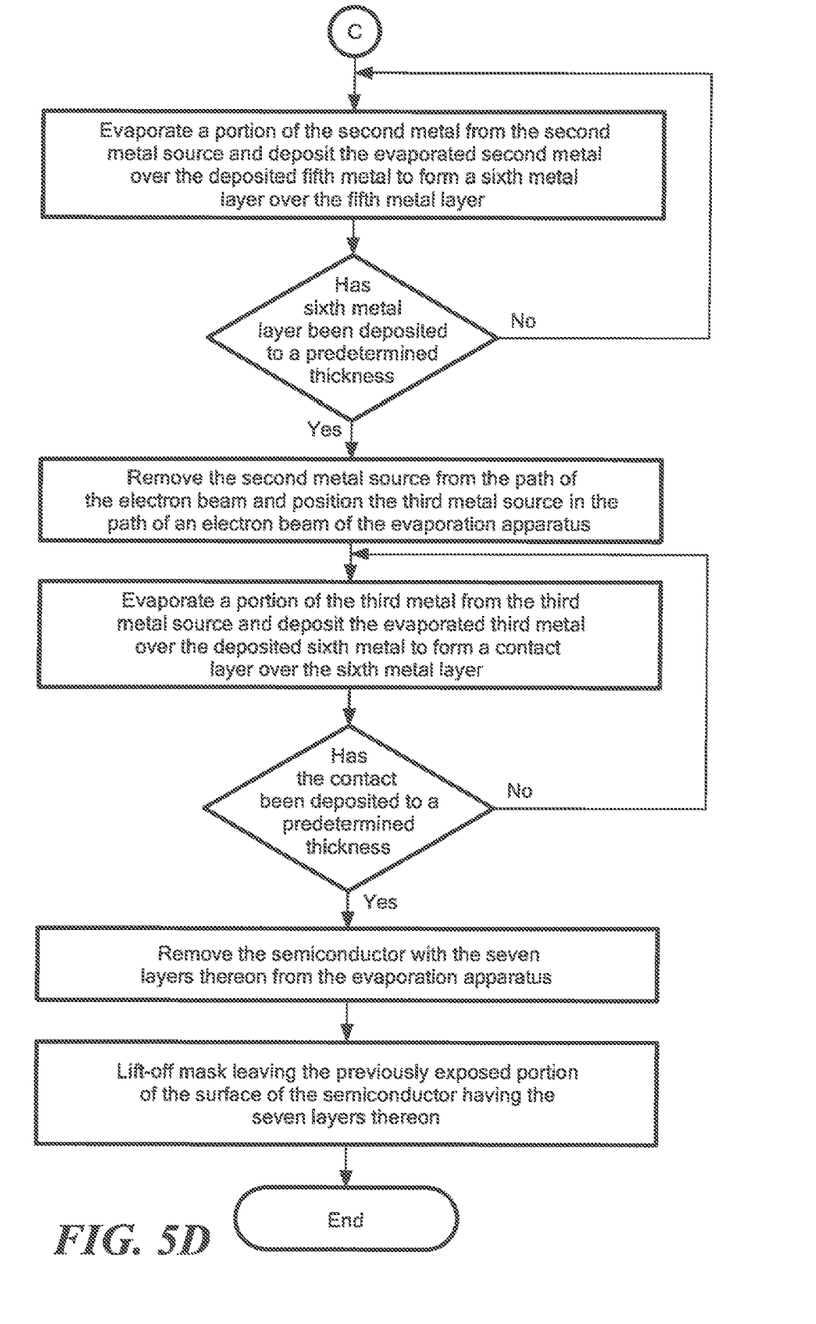

A portion of a first metal, here Ni, is evaporated from the first metal source 44a and deposited onto the mask 50 and onto the exposed portion 53 of the surface of the semiconductor 11 (more particularly AlGaN layer 16) forming a Schottky contact between the portion of the first metal Ni and the exposed portion 53 of the AlGaN layer 16 to form a first metal layer 60a over the mask 50 and the exposed portion of the layer 16, as shown in FIG. 4B.

The evaporation process continues in situ until first metal layer 60a has a predetermined thickness, here for example in a range 10 Angstroms to 500 Angstroms thereby completing layer 24 (FIG. 2). The hearth 43 is rotated about axis 46 to remove the first source 44a away from the spatial region 42 (FIG. 3A) and the second metal source 44b is positioned in the path of an electron beam 41; more particularly, the hearth 43 is rotated about axis 46 to position the second source 44b into spatial region 42 (FIG. 3A).

A portion of a second metal, here Pt, is evaporated from the second metal source 44b and deposited onto the first layer 60a forming a second metal layer 60b over the first metal layer 60a, as shown in FIG. 4B, thereby completing layer 26 (FIG. 2).

The evaporation process continues until second metal layer 60b has a predetermined thickness, here for example in a range from 10 Angstroms to 1000 Angstroms thereby completing layer 26 (FIG. 2).

The process continues in like manner forming layers 60c-60f, with layers 60c, and 60e being Ni with thickness in the range 10 Angstroms to 500 Angstroms and layers 60d and 60f being Pt with thickness in the range from 10 Angstroms to 1000 Angstroms. Thereby completing layers 28, 30, 32 and 34 (FIG. 2).

After forming layer 60f, the hearth 43 is rotated about axis 46 to remove the second source 44b away from the spatial region 42 (FIG. 3A) and the third metal source 44c is positioned in the path of an electron beam 41; more particularly, the hearth 43 is rotated about axis 46 to position the third source 44c into spatial region 42 (FIG. 3A).

A portion of a third metal, here Au, is evaporated from the third metal source 44c and deposited onto the 60f forming a seventh metal layer 60g over the sixth metal layer 60f, as shown in FIG. 4B thereby completing layer 22 (FIG. 2).

The evaporation process continues until seventh metal layer 60g has a predetermined thickness, here for example in a range 3000 Angstroms to 1 um.

The semiconductor 11 with the seven layers 60a-60g thereon is then removed from the evaporation apparatus 34 (FIG. 3A) and the mask 50 is lifted-off, along with the portions of the seven layers 60a-60g thereon, leaving the previously exposed portion of the surface of the semiconductor 11 having the seven layers thereon, resulting in the FET 10 shown in FIG. 2.

Figure 6:
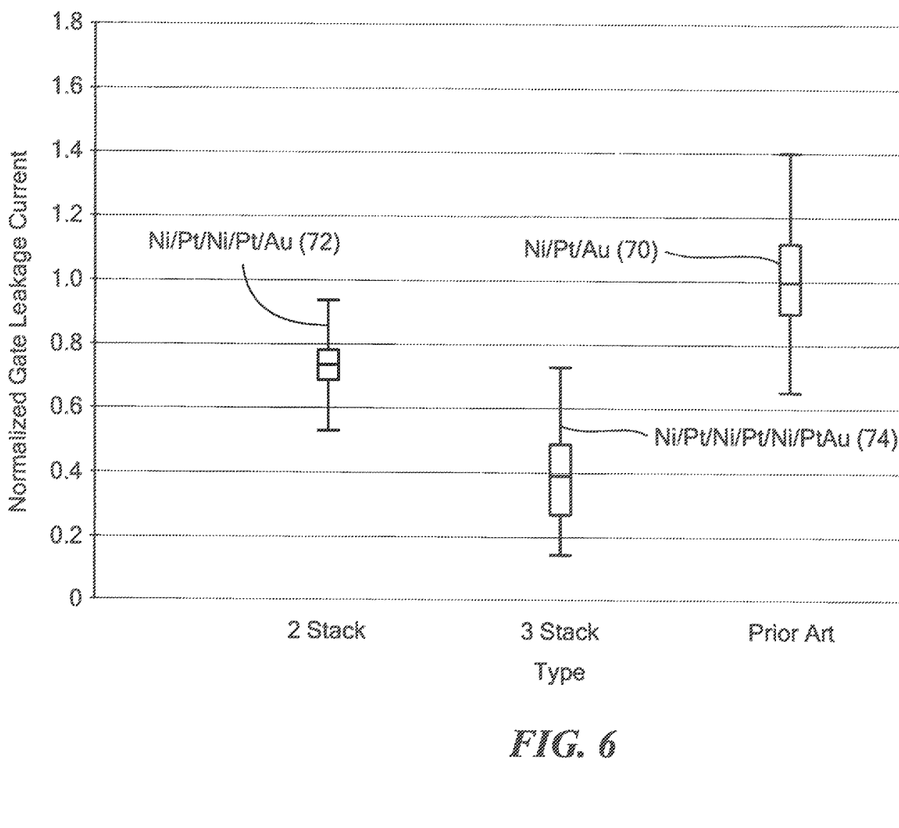
FIG. 6 is a chart showing normalized gate leakage current for: a FET according to the PRIOR ART; the FET according to FIG. 2; and a FET having a gate electrode structure according to another embodiment of the disclosure.

Referring now to FIG. 6, a chart showing: (A) gate leakage current for the FET 10 according to FIG. 2 (indicated by 72); "three-stack" device having three stacks, each stack having a lower Ni layer 24, 28, 32, respectively, and an upper Pt layer 26, 30, and 34, respectively, and a top. electrode 22 of Au; and (B) leakage current for a FET (74) having a gate electrode structure according to another embodiment of the disclosure; here having a "two-stack" gate electrode structure having as the first layer of a first metal Ni, in Schottky contact with the semiconductor layer; a second layer of a second metal, here Pt, in direct contact with the first layer; a third layer of the first metal (Ni) in direct contact with the second layer (Pt); a fourth layer of the second metal (Pt) in direct contact with the third layer (Ni); and the electrode, here Au; both (A) and (B) being normalized by the leakage current of a FET according to the PRIOR ART (indicated by (70). The "two-stack" device has two stacks, each stack having a lower layer of Ni and an upper layer of Pt. The thickness of the Ni in the PRIOR ART device (70), the Ni in the "two-stack" device (72) and the Ni in the "three-stack" device (72) are all the same thickness. Further, the thickness of the Pt in the PRIOR ART device (70), the Pt in the "two-stack" device (72) and the Pt in the "three-stack" device (72); while they may be different from the thickness of the Ni, are all the same thickness.

It is noted that the normalized gate leakage current for the FET according to the PRIOR ART (indicated by 70) has a median value of 1.0 and a range of 0.65 to 1.4; whereas the normalized gate leakage current for FET 10 according to FIG. 2 (indicated by 72) is in a range of 0.3 to 0.5 with a median of 0.4 or 60 percent lower than the leakage current of the PRIOR ART FET. The normalized gate leakage current FET indicated by 72 is in a range of 0.5 to 0.8 with a median value of 0.65 or 35 percent lower than the leakage current of the PRIOR ART FET.

A number of embodiments of the disclosure have been described. Nevertheless, it will be understood that various modifications may be made without departing from the spirit and scope of the disclosure. For example, while the semiconductor device has been described above as a FET, the Schottky contact structure may be used with other devices such as diodes and photodetectors. Further, the Schottky contact may be made with other Group III-N semiconductor materials. Accordingly, other embodiments are within the scope of the following claims.

What is claimed is:

1. A Schottky contact structure, comprising:
   a Schottky contact, comprising:
      a plurality of stacks of metal layers, each one the stacks, comprising:
         a first layer of a first metal; and
         a second layer of a second metal on the first layer;
         wherein the first metal of the first layer of a first one of the plurality of stacks is in Schottky contact with a semiconductor;
      and
   an electrode for the Schottky contact disposed on the Schottky contact, the electrode having a third metal, the third metal is in direct contact with the second metal of the second layer of an upper most one of the plurality of stacks of metal layers.

2. The Schottky contact structure recited in claim 1 and wherein the second metal provides a barrier against migration between the third metal and the first metal.

3. The gate electrode structure recited in claim 1 wherein the first metal is nickel; the second metal is platinum; and the third metal is gold.

4. The Schottky contact structure recited in claim 1 wherein the second metal of the second layer is in direct contact with the first metal of the first layer.

5. The Schottky contact structure recited in claim 4 wherein first metal of the third layer is in direct contact with the second metal of the fourth layer.

6. The Schottky contact structure recited in claim 5 wherein the second metal of the second layer is in direct contact with the first metal of the first layer.

7. The Schottky contact structure recited in claim 5 wherein first metal of the fifth layer is in direct contact with the second metal of the fourth layer.

8. The Schottky contact structure recited in claim 7 wherein first metal of the fifth layer is in direct contact with the second metal of the sixth layer.

9. A Schottky contact structure, comprising:
   a Schottky contact, comprising:
      a first layer of a first metal in Schottky contact with a semiconductor;
      a second layer of a second metal on the first layer;
      a third layer of the first metal on the second layer;
      a fourth layer of the second metal on the third layer; and an electrode for the Schottky contact structure disposed on the Schottky contact, the electrode having a third metal, the second metal providing a barrier against migration between the third metal and the first metal;

wherein the second metal of the second layer is in direct contact with the first metal of the first layer;

wherein the first metal of the third layer is in direct contact with the second metal of the second layer;

wherein the second metal of the fourth layer is in direct contact with the first metal of the third layer;

wherein the first metal of a fifth third layer is in direct contact with the second metal of the fourth layer;

wherein the second metal of a sixth layer is in direct contact with the first metal of the fifth layer;

wherein the third metal of the electrode is in direct contact with the second metal of the sixth layer; and wherein the first metal is nickel; the second metal is platinum; and the third metal is gold.

10. A Schottky contact structure, comprising:
a Schottky contact in Schottky contact with a semiconductor, the Schottky contact comprising a plurality of stacks, each one of the stacks comprising a lower layer of Ni and upper layer of Pt and wherein the Ni is in direct contact with the Pt; and including an electrode on the Schottky contact.

11. The Schottky contact structure recited in claim 10 wherein the electrode comprises a layer of gold on the Ni of the upper one of the plurality of stacks.

12. The Schottky contact structure recited in claim 11 wherein the layer of gold is in direct contact with the Ni of the upper one of the plurality of stacks.

13. A Field Effect Transistor, comprising:
a source;
a drain;
a gate electrode structure disposed between the source and the drain for controlling a flow of carriers between the source and the drain, the gate electrode structure, comprising:
a Schottky contact, comprising:
a plurality of stacks of metal layers, each one the stacks, comprising:
a first layer of a first metal; and
a second layer of a second metal on the first layer;
wherein the first metal of the first layer of a first one of the plurality of stacks is in Schottky contact with a semiconductor;
and
an electrode for the Schottky contact an structure disposed on the Schottky contact, the electrode having a third metal, the electrode having a third metal in direct contact with the second metal of the second layer of an upper most one of the plurality of stacks of metal layers.

14. The Field Effect Transistor recited in claim 13 wherein the second metal provides a barrier against migration between the third metal and the first metal.

* * * * *